(12) United States Patent
Ashton

(10) Patent No.: US 9,316,673 B2
(45) Date of Patent: Apr. 19, 2016

(54) METHOD FOR DETERMINING CAPACITANCE OF A DEVICE

(71) Applicant: SEMICONDUCTOR COMPONENTS INDUSTRIES, LLC, Phoenix, AZ (US)

(72) Inventor: Robert A. Ashton, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 43 days.

(21) Appl. No.: 14/321,999

(22) Filed: Jul. 2, 2014

(65) Prior Publication Data

US 2014/0312922 A1     Oct. 23, 2014

Related U.S. Application Data

(62) Division of application No. 14/028,774, filed on Sep. 17, 2013, now Pat. No. 8,803,529, which is a division of application No. 12/941,632, filed on Nov. 8, 2010, now Pat. No. 8,564,301.

(51) Int. Cl.
*G01R 27/26* (2006.01)
*G01R 31/26* (2014.01)

(52) U.S. Cl.
CPC ........ *G01R 27/2605* (2013.01); *G01R 31/2601* (2013.01)

(58) Field of Classification Search
CPC ............. H02J 7/345; H02J 3/005; H02J 3/18; H02J 3/12; H02J 7/00; G05F 1/70; G01R 27/2605; G01R 31/2601; G01R 21/133; G01R 22/10; G01R 15/16; G01R 19/2513; G01R 1/06788; G01R 21/06; G01R 31/362; G01R 31/3682; G06F 11/3058; G06F 11/3089; G06F 1/26; G06F 1/3209; G06F 1/325; H01L 27/0805; G01D 21/00; G01N 27/00; G01N 27/002; H01H 9/54; H01H 9/542; H02H 7/16; G01F 1/8431; G01F 1/84363
See application file for complete search history.

(56) References Cited

U.S. PATENT DOCUMENTS

| 3,612,997 | A |   | 10/1971 | Paulkovich |
| 4,283,676 | A |   | 8/1981  | Shaw |
| 4,831,325 | A |   | 5/1989  | Watson, Jr. |
| 5,942,909 | A | * | 8/1999  | Zhu ......................... H01L 22/14 257/E21.531 |
| 6,114,861 | A | * | 9/2000  | Takeo .................. G01R 31/028 324/658 |
| 7,589,538 | B2 |  | 9/2009  | Novikov et al. |
| 7,834,649 | B2 |  | 11/2010 | Agarwal et al. |

FOREIGN PATENT DOCUMENTS

JP          359099358 A      6/1984

* cited by examiner

*Primary Examiner* — Vinh Nguyen
(74) *Attorney, Agent, or Firm* — Robert F. Hightower

(57) ABSTRACT

A device and method of determining a capacitance of a device is provided, which in one embodiment includes connecting a first terminal of a capacitor having a known capacitance to the first terminal of the device, applying an AC voltage to the first terminal of the device and the first terminal of the capacitor, measuring a current through the capacitor, measuring a current through the device, determining a first voltage across the device as a function of time, computing a capacitance of the device as a function of time by multiplying the capacitance of the capacitor by the ratio of the current through the device to the current through the capacitor, determining a capacitance of the device as a function of voltage based on the capacitance as a function of time and the first voltage across the device as a function of time, and outputting data of the first capacitance of the device as a function of voltage.

8 Claims, 6 Drawing Sheets

METHOD FOR DETERMINING CAPACITANCE OF A DEVICE

This application is a divisional application of prior U.S. patent application Ser. No. 14/028,774 filed on Sep. 17, 2013, now U.S. Pat. No. 8,803,529, which was a divisional application of application Ser. No. 12/941,632, filed on Nov. 8, 2010, now U.S. Pat. No. 8,564,301, which are both hereby incorporated herein by reference, and priority thereto for common subject matter is hereby claimed.

BACKGROUND OF THE INVENTION

The present invention generally relates to methods and devices for testing electronics, and more particularly to methods and devices for determining the capacitance of a component.

Capacitance is a fundamental parameter of electronic components. It is important for a circuit designer to know a component's capacitance in order to be able to design circuits that will perform as expected. Accurate knowledge of the capacitance of a component allows the circuit designer to select the appropriate component for the circuit. For example, low capacitance components may be desirable for achieving low insertion losses. Also, components having a low capacitance as a function of voltage are desirable for low harmonics. Accordingly, accurate and relevant values of capacitance of components are needed by system designers.

Capacitance measurement of components having a capacitance that is not simply a function of voltage, such as for thyristors, surge protection devices, and bidirectional transient voltage suppressors, can be especially challenging. Such devices typically have diode isolated internal nodes that charge when the diodes are forward biased and remain charged when the voltage is removed. These internal nodes discharge with leakage current over time. During use the nodes are recharged at the signal frequency and therefore often do not have time to discharge. Thus, accurate measurement of the capacitance of such devices is challenging because such measurement is both voltage and time dependent.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities depicted in the drawings.

DETAILED DESCRIPTION OF ILLUSTRATIVE EMBODIMENTS

Figure 1:
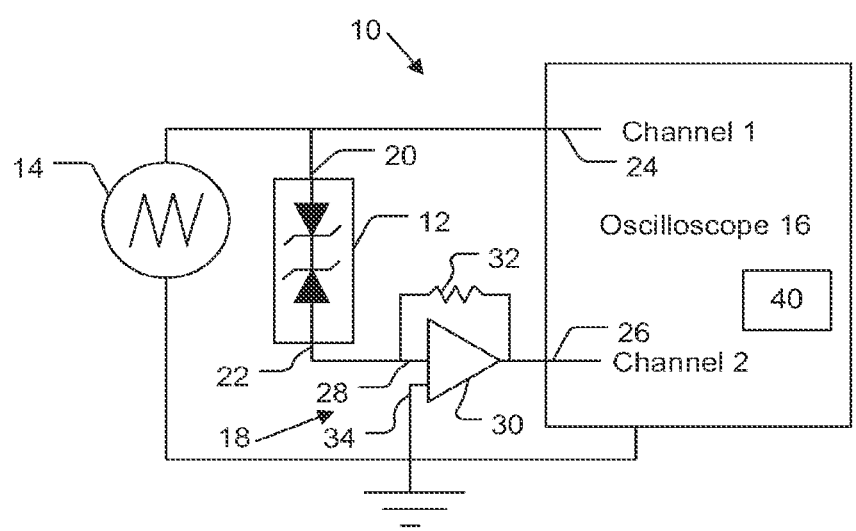
FIG. 1 is a circuit diagram of a measurement system for determining capacitance of a device under test as a function of voltage of an example embodiment according to the present invention.

In the following description, for purposes of explanation and not limitation, specific details are set forth, such as particular devices, components, test equipment, connection methods, techniques, data protocols, software products and systems, operating systems, development interfaces, hardware, etc. in order to provide a thorough understanding of the present invention.

However, it will be apparent to one skilled in the art that the present invention may be practiced in other embodiments that depart from these specific details. Detailed descriptions of well-known computers, devices, components, test equipment, connection methods, techniques, data protocols, software products and systems, operating systems, development interfaces, and hardware are omitted so as not to obscure the description of the present invention.

According to an example embodiment of the present invention, a method and device are provided for determining the capacitance of a device under test (DUT). The method may be used for any electronic component, although the description below is provided in the context of a component having a capacitance that is not simply a function of voltage, but is also time dependent (e.g., dependent on the frequency of an applied signals). Such devices include, for example, thyristors, surge protection devices, and bidirectional transient voltage suppressors.

In various embodiments of the present invention, an alternating current (AC) voltage having a period that is less than an estimated characteristic time of the DUT is applied across the DUT. Rather than only measure the magnitude and phase of the voltage and current at the DUT, a full voltage waveform of the voltage applied over time and a full current waveform of the current through the DUT over time are measured concurrently. The capacitance of the DUT may be calculated by dividing the measured current through the DUT by the change in voltage with respect to time of the applied AC voltage signal. The change in voltage with respect to time may be calculated from the measured AC voltage or from the known parameters of the voltage source. In an alternative embodiment, a capacitor is used (referred to herein as a reference capacitor) having a known capacitance that is not a function of time (i.e., at the frequency of the applied AC signal) and preferably not a function of voltage. The reference capacitor also receives the same AC voltage signal and the measured current through the reference capacitor is used to determine the capacitance of the DUT. Specifically, the capacitance of the DUT may be determined by multiplying the value of the reference capacitor by the ratio of the current through the DUT divided by the current through the reference capacitor. In both embodiments, the capacitance determined for the DUT is a function of voltage. In other words, a characteristic capacitance curve as a function of voltage may be determined. The test and computations may be repeated with voltages having different amplitudes to provide a plurality of characteristic capacitance curves, each associated with a different voltage range (although the voltage ranges may be overlapping). Different AC frequencies also may be used.

It may be desirable to apply an AC voltage signal with a large-amplitude, high frequency voltage that has a period that is substantially less than the characteristic time for the DUT's capacitance (i.e., the time the DUT takes to discharge by 1/e (approximately 63%) of the way to the final voltage). In some embodiments, a period that is "substantially less" than the characteristic time of the DUT's capacitance may comprise a period that is less the characteristic time of the DUT's capacitance by a factor of ten, more preferably by a factor of fifty, yet more preferably by a factor of one hundred, and still more preferably by a factor of two hundred. When the DUT has a capacitance that is dependent on time (e.g., frequency of the applied signal) and voltage, and an applied signal has a period that is too long (relative to the characteristic time of the DUT), the determined capacitance of the DUT may be inaccurate. For example, for a thyristor, surge protection device, bidirectional transient voltage suppressor or other component having a capacitance that is not simply a time-independent function of voltage, the measurements may not be correct for the eventual application of the DUT where the applied signal's peak voltage levels are large and determination of the capacitance as a time-dependent function of voltage is desired.

Consider the example of a thyristor or a bidirectional transient voltage suppressor (bidirectional TVS). Thyristors and bidirectional TVS's have diode isolated internal nodes. Such nodes charge when the diodes are forward biased by a voltage. The nodes remain charged when the voltage is removed. Of significance is that the charged nodes exhibit a reduced diode capacitance. Gradually, these internal nodes discharge with a leakage current occurring over a typical discharge time (i.e., a characteristic time) of up to tens of seconds. Under actual use conditions, the thyristor and bidirectional TVS will recharge during the next cycle of the applied signal frequency, and thus may not have time to fully discharge. Accordingly, when the AC voltage signal applied to the DUT to determine the capacitance of the DUT has too low a frequency or too low a voltage, the DUT will completely discharge during each cycle of the applied AC signal. In some measurement conditions, the capacitance may discharge within a small fraction of the period of the applied signal. As a result, the component's computed capacitance may be rated at or close to a maximum capacitance corresponding to a fully discharged capacitance. Thus, the determined capacitance may be higher than the capacitance experienced by a circuit having such a DUT in an actual use condition in which the capacitor does not fully discharge before being recharged.

Applying a small sine wave signal, or a small sine wave signal superimposed on a DC voltage, for example, may yield correct capacitance versus information only for limited applications, or only for a DUT having a capacitance value that is a function of voltage only. If the DUT has a time dependence capacitance, such measurements may not be correct for an actual application where applied signal levels are large and capacitance as a time-dependent function of voltage needs to be predicted. Therefore, in many instance it is desirable that the applied AC voltage for determining DUT capacitance have a large, high frequency voltage swing with a period that is substantially less than the characteristic time of the DUT's capacitance. This reduces the likelihood that the DUT completely discharges before the next cycle of the applied AC signal, which more accurately simulates a use condition.

FIG. 1 depicts a first test configuration 10 for determining the capacitance of a component by measuring voltage applied to, and current through, a device under test 12. The test configuration 10 includes an AC voltage signal source 14, an oscilloscope 16, and in some embodiments a current-to-voltage amplifier 18. The oscilloscope 16 may include or be coupled to a processor 40, computing device or other digital or analog computation circuit. Although in the illustrated embodiment the DUT 12 is shown as back to back diodes, the DUT 12 may be any electronic component.

A first terminal 20 of the DUT 12 is connected to the AC voltage signal source 14 to receive the AC voltage signal. The first terminal 20 also is coupled to a first channel 24 of the oscilloscope 16. A second terminal 22 of the DUT 12 is coupled to a second channel 26 of the oscilloscope 16. For a DUT 12 having a very low capacitance, the second terminal 22 may be coupled to the second channel 26 of the oscilloscope 16 via a current-to-voltage amplifier 18 as is illustrated. For devices not having such a low capacitance, the current-to-voltage amplifier 18 may be omitted so that the second terminal 22 of the DUT 12 is directly connected to the second channel 26 of the oscilloscope 16 (e.g., where the channel has a 50 ohm input impedance). In such a configuration, the current may be computed as the measured voltage divided by the input impedance of the oscilloscope (e.g., V divided by fifty ohms). In this example embodiment, the second terminal 22 of the DUT 12 is coupled to a first input 28 of the amplifier 18, while the amplifier 18 output is coupled to the oscilloscope's second channel 26. The amplifier 18 may be formed, for example, by an operational amplifier 30 and a resistor 32 that is coupled across the operational amplifier output and the first input 28 of the operational amplifier 30. The AC voltage signal source 14, the oscilloscope 16, and the second input 34 of the amplifier 30 are grounded commonly.

Figure 2:
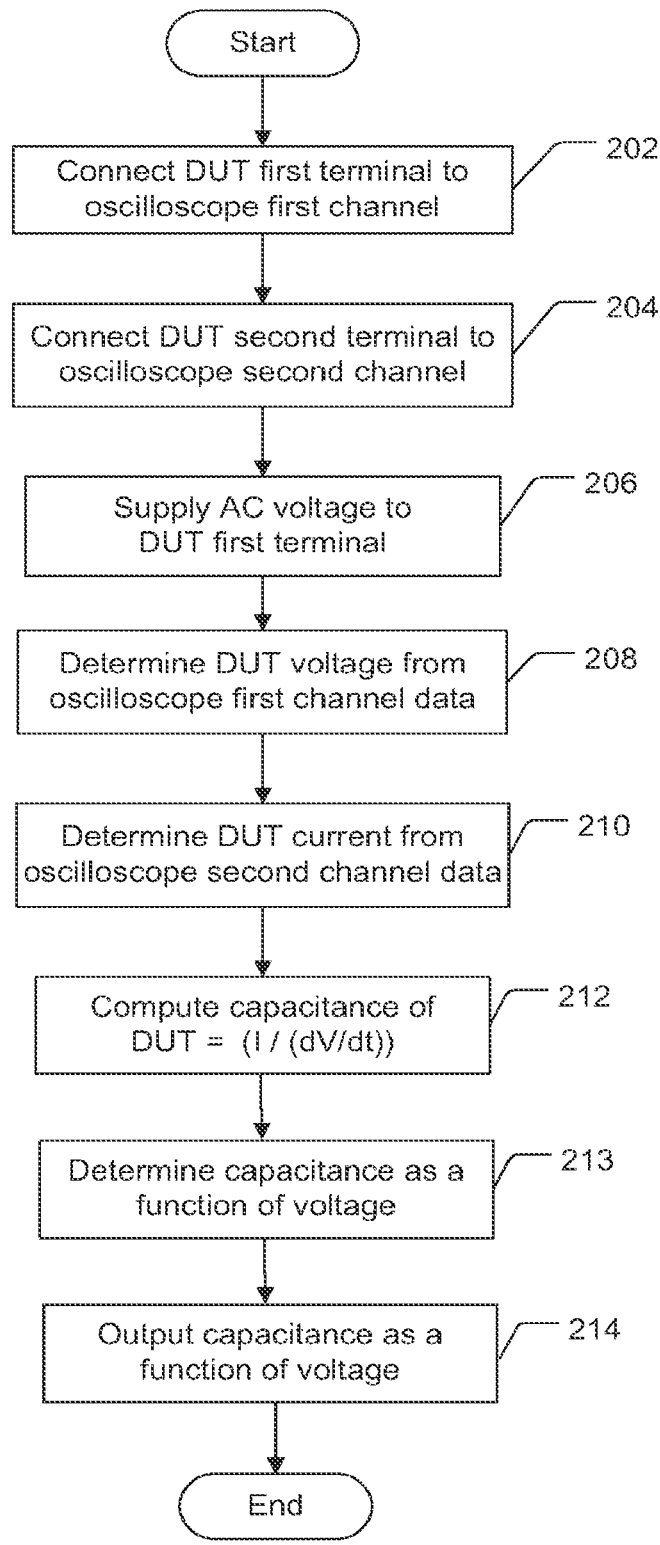
FIG. 2 is a flow chart of a method for determining capacitance of a device under test of an example embodiment according to the present invention.

FIG. 2 is a flow chart of a method for determining capacitance of a DUT according to a first example embodiment of the present invention. At 202, the first terminal of the DUT 12 is connected to a first channel 24 of the oscilloscope 16. At 204, the second terminal of the DUT is connected to the second channel 26 of the oscilloscope 16. The second terminal of the DUT may be connected to the second channel directly or via an amplifier as illustrated in FIG. 1. At 206, the AC voltage signal source 14 supplies an AC voltage signal to the first terminal 20 of the DUT 12. The instantaneous voltage at the DUT first terminal 20 over time is measured by the oscilloscope's first channel 24 at 208. While this example embodiment measures the voltage applied to the DUT through use of the oscilloscope 16, in other embodiments a known voltage may be applied thereby eliminating the need to measure the voltage supplied to the DUT. At 210, the instantaneous current through the DUT 12 over time is measured by the oscilloscope's second channel 26. The measured voltage and current also may be displayed and recorded by the oscilloscope 16.

At 212, the capacitance of the DUT 12 is computed as the current through the DUT 12 (as measured by the second channel) divided by the change in DUT voltage at the input of the DUT 212 (as measured by the first channel) with respect to time (dV/dt) or by the following equation:

$$C(t) = I(t)/(dV/dt); \quad \text{Equation A}$$

where:
  I(t)=the current through the DUT over time as measured by the second channel of the oscilloscope 16.
  dV/dt=the change in voltage with respect to time at the first terminal of the DUT as measured by the first channel of the oscilloscope. In other words, the derivative with respect to time of the data from the first channel is used.

Such computation may be performed by processor 40, a computing device, or other digital or analog circuit in or communication with (or receiving the data from) the oscilloscope 16.

Those skilled in the art will recognize that in this embodiment the above equation does not include a coefficient (i.e., to factor in the amplifier gain and/or a conversion factor to convert a measured voltage to current), because such data may be inputted into the oscilloscope or into the automated software of the computing device and therefore need not to be included separately into the above equation (i.e., such coefficient is already factored in). In other embodiments, where the computing device does not accept such data, the above equation may include a coefficient. Having determined capacitance as a function of time from the equation above, and having the measured voltage (or known applied voltage) as a function of time, the capacitance can be plotted versus voltage on a time point by time point bases to provide the capacitance as a function of voltage (C(V)) at 213. The computed capacitance as a function of voltage may be outputted in tabular or graphical form at 214.

Figure 3:
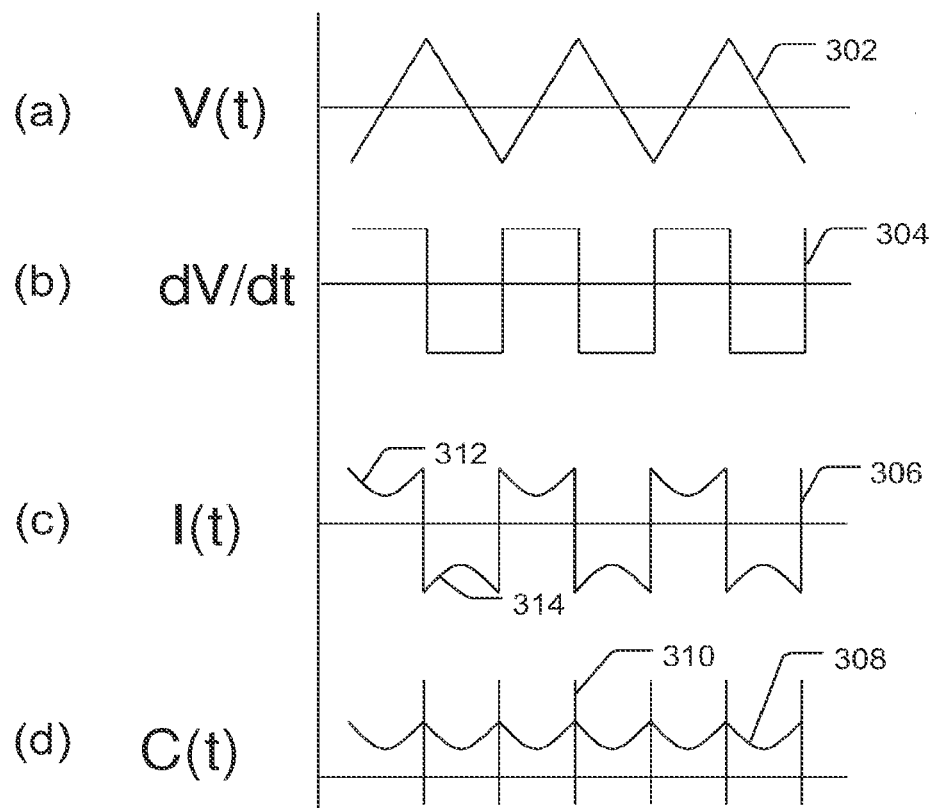
FIG. 3 depicts signal waveforms determined via a method of an example embodiment according to the present invention.

FIG. 3 depicts graphs (a)-(d) of signal waveforms measured or determined using test configuration 10 of FIG. 1 implementing the example capacitance determination method of FIG. 2. Graph (a) depicts a waveform 302 of the voltage measured at the first channel 24 of the oscilloscope 16 as a function of time with voltage corresponding to the vertical axis and time corresponding to the horizontal axis. In this example, a triangular wave AC signal is generated by the AC voltage signal source 14 and applied to the first terminal 20 of the DUT 12. Although the triangular waveform is used in this embodiment, the AC voltage signal may have other characteristic shapes in alternate embodiments. A benefit of the triangular waveform is that the applied AC signal maintains a large dV/dt with respect to the maximum voltage as compared, for example, to a sine wave. While this example embodiment measures the voltage applied to the DUT through use of the oscilloscope 16, in other embodiments a known voltage may be applied thereby eliminating the need to measure the voltage supplied to the DUT.

Graph (b) depicts a waveform 304 of the change in voltage over time (i.e., dV/dt) with dV/dt corresponding to the vertical axis and time corresponding to the horizontal axis. The data for dV/dt may be obtained by computing the derivative of the applied voltage with respect to time (i.e., derivative of the data from the oscilloscope first channel 24 (depicted in graph (a)) or, an alternate embodiment, the derivative of the applied known voltage). The derivative may be computed by the oscilloscope or by post processing software executing on a computer that receives the measurement data from the oscilloscope. For an applied triangular wave voltage signal the dV/dt waveform 304 has a generally square wave shape as is illustrated.

Graph (c) depicts a waveform 306 of the current through the DUT that is measured at the second channel 26 of the oscilloscope 16 as a function of time (i.e., I(t)) with current corresponding to the vertical axis and time corresponding to the horizontal axis. It is noted that although the current from the second terminal 22 of the DUT may pass through the amplifier 18, the signal received at the oscilloscope second channel 26 is proportional to the current through the DUT 12. The current waveform 306 has a generally curved portion 312 (at a first polarity) during the corresponding increase in V(t), and an opposite generally curved portion 314 (at an opposite polarity) during the corresponding decrease in V(t). These curved portions 312 and 314 are related to the capacitance as a function of voltage or C(V).

Graph (d) depicts a waveform 308 of the capacitance of the DUT as a function of time (i.e., C(t)) computed using Equation A and data from waveforms 304 and 306, with capacitance corresponding to the vertical axis and time corresponding to the horizontal axis. The vertical lines 310 correspond to times at which the dV/dt polarity changes (which correspond to the amplitude peaks of the applied voltage V(t)).

As discussed above, the capacitance of the device is computed as:

$$C(t) = I(t)/(dV/dt)$$

Figure 4:
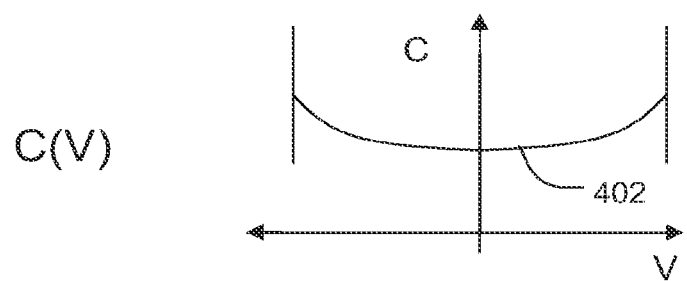
FIG. 4 depicts capacitance as a function of voltage determined via a method of an example embodiment according to the present invention.

Having determined capacitance as a function of time from the equation above, and having the measured voltage (or known applied voltage) as a function of time, the capacitance can be plotted versus voltage on a time point by time point bases to provide the capacitance as a function of voltage (C(V)) for the applied voltage. FIG. 4 depicts a waveform 402 of the DUT capacitance as a function of voltage, with capacitance corresponding to the vertical axis and voltage corresponding to the horizontal axis. Thus, the graph of FIG. 4 may be generated by the data collected over one cycle of the applied AC signal such as, for example, a time point by time point plot of the capacitance data of graph (d) of FIG. 3 versus the voltage data from graph (a) of FIG. 3. It also may be necessary to shift the data from one or both oscilloscope channels (i.e., a time shift to ensure the measurement data of the channels is synchronized in time) to account for different cable lengths (of the cables connected to the oscilloscope), especially at higher frequencies. Comparing the capacitance to the applied voltage (graph (a)), as the voltage across the DUT approaches zero, capacitance decreases. As the voltage increases or decreases away from zero volts, the capacitance increases. Of particular interest is that the peak capacitance may be less than a maximum capacitance for the DUT that would be obtained by using a voltage signal having too long of a period (i.e., longer than the DUT capacitance characteristic time) or by using a small AC signal method with a DC bias to determine capacitance versus voltage. Also, of interest is that the capacitance varies during the entire period of the applied AC voltage signal. Under a test condition having a period substantially greater than the characteristic time, the capacitance as a function of voltage may be very different. Accordingly, the rated, average capacitance of a component might be incorrectly computed to be too high and not reflect the variations depicted in FIG. 4. The values depicted in FIG. 4 may be output, stored and associated with the device under test 12 to characterize the DUT capacitance as a function of voltage. The test may be repeated using AC voltage signals having different amplitudes (and in some instances different frequencies) so that a plurality of curves is generated. Such characteristic capacitance curves may be beneficial for design engineers when selecting or otherwise evaluating a component to be included in a circuit. It is worth noting that different devices may have different values and different curve shapes than those depicted herein.

Figure 5:
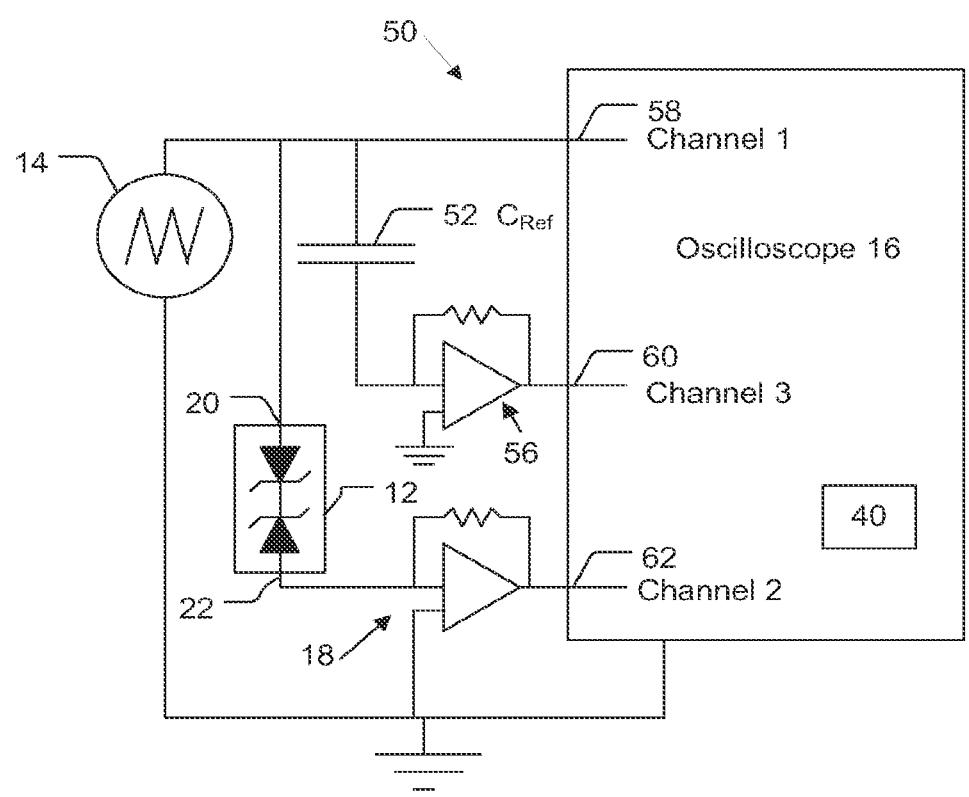
FIG. 5 is a circuit diagram of a measurement system for determining capacitance of a device under test as a function of voltage via a second example embodiment according to the present invention.

FIG. 5 depicts a test configuration 50 of a second example embodiment of the present invention for determining the capacitance of a device under test 12. The test configuration 50 of FIG. 5 is similar to the test configuration 10 of FIG. 1 with like components given the same label numbers. The test configuration 50 includes an AC voltage signal source 14, a reference capacitor ($C_{Ref}$) 52, an oscilloscope 16, and in some embodiments one or more current-to-voltage amplifiers 18, 56. Although in the illustrated embodiment the DUT 12 is shown as back to back diodes, the DUT 12 may be any electronic component. The reference capacitor 52 has a known capacitance over the applied voltage range and which is substantially independent of (and constant at) the voltage and frequency of the applied voltage signal. The oscilloscope 16 may include or be coupled to a processor 40, computing device or other digital or analog computation circuit. Inclusion of the reference capacitor 52 and use of the current through the reference capacitor 52 in determining the capacitance of the DUT avoids errors that may occur when determining dV/dt of the previously described embodiment.

The DUT 12 may have a first terminal 20 which receives the AC voltage signal from the AC voltage signal source 14, and is coupled to a first channel 58 of the oscilloscope 16. The DUT 12 may have a second terminal 22 which is coupled to a second channel 62 of the oscilloscope 16, either directly or via a current-to-voltage amplifier 18 (as is illustrated), such as an amplifier 18 having a configuration as previously described with regard to FIG. 1.

The reference capacitor 52 has a first terminal that also receives the AC voltage signal from the AC voltage signal source 14, and therefore also is coupled to the first channel 58 of the oscilloscope 16. A second terminal of the reference capacitor 52 is coupled to a third channel 60 of the oscilloscope 16, either directly or via another current-to-voltage amplifier 56 (as is illustrated). The current-to-voltage amplifier 56 may be configured in the same manner as current-to-voltage amplifier 18, with the output coupled to the oscilloscope and a feedback resistor coupled between the output and the one of the inputs (and the reference capacitor 52). The AC voltage signal source 14, the oscilloscope 16, (and if incorporated into the test configuration, the amplifiers' second inputs) are connected to a common ground.

Figure 6:
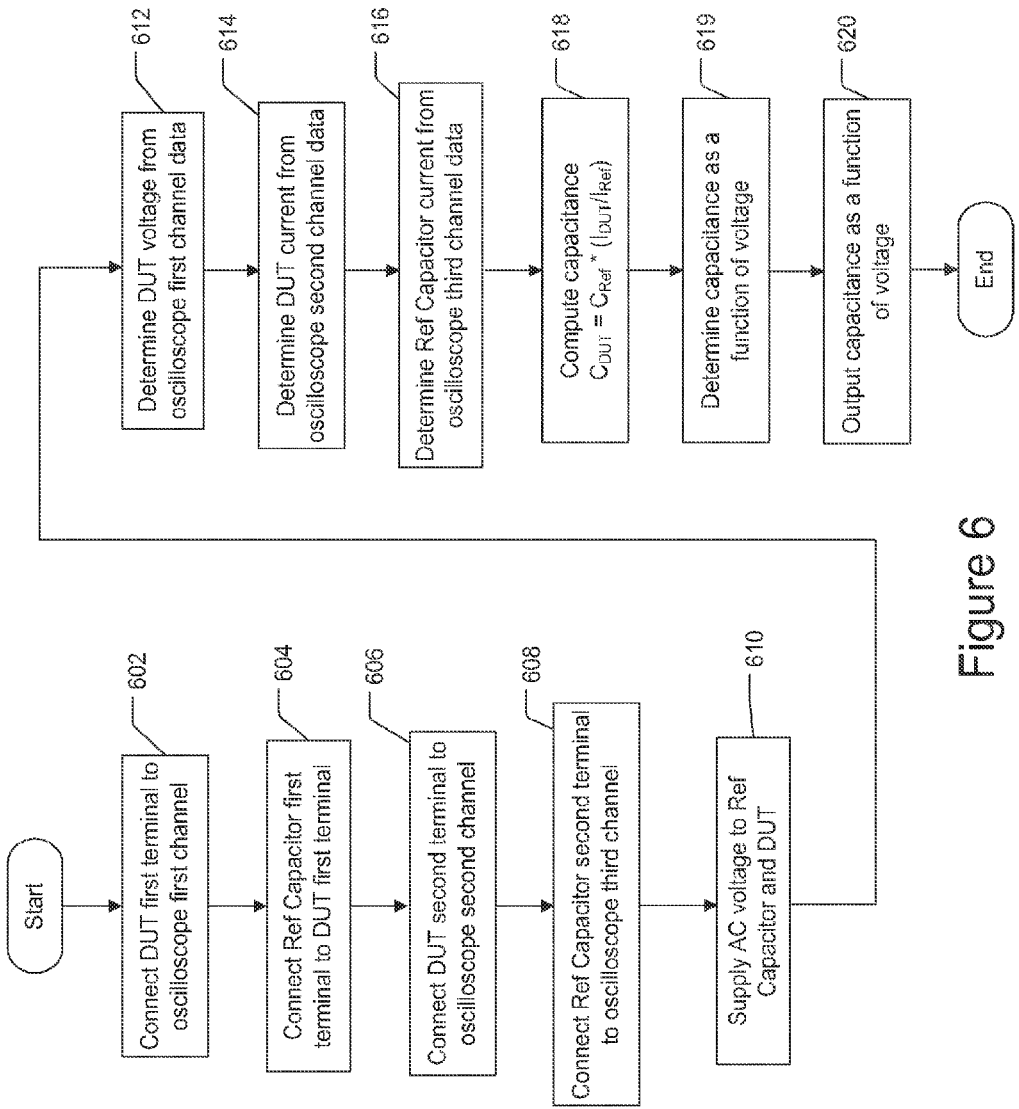
FIG. 6 is a flow chart of a method for determining capacitance of a device under test via a second example embodiment according to the present invention.

FIG. 6 is a flow chart of a method for determining capacitance of the device under test according to the second example embodiment of the present invention. At 602, the first terminal 20 of the DUT 12 is connected to the first channel 58 of the oscilloscope 16 and the AC voltage signal source 14 to measure the instantaneous voltage applied to the DUT 12. At 604, a first terminal of the reference capacitor 52 is connected to the first terminal 20 of the DUT 12, the first channel 58 of the oscilloscope 16, and the AC voltage signal source 14. Accordingly, the AC voltage signal is commonly applied to the DUT 12 and the reference capacitor 52. At 606, the second terminal 22 of the DUT is connected to a second channel 62 of the oscilloscope 16, such as directly or via the current amplifier 18, to measure the current through the DUT 12. At 608, the second terminal of the reference capacitor 52 is connected to a third channel 60 of the oscilloscope 16, such as directly or via the current-to-voltage amplifier 56, to measure the current through the reference capacitor 52. The measured currents and voltage may be output, displayed and recorded by the oscilloscope 16. At 610, the AC voltage signal source 14 supplies an AC voltage signal to the reference capacitor 52 and the DUT 12.

At 612, the voltage applied to the DUT 12 is determined by measurement at the first channel 58 of the oscilloscope 16. In other embodiments, a known voltage source may be used so that so that measurement is not necessary (and processes 602 and 604 may be omitted). At 614, the current through the DUT 12 is measured at the second channel 62 of the oscilloscope 16. At 616, the current through the reference capacitor 52 is measured at the third channel of the oscilloscope. At 618, the capacitance of the DUT 12 is computed by multiplying capacitance of the reference capacitor (capacitor 52) by the ratio of the current through the DUT divided by the current through the reference capacitor (capacitor 52) as illustrated by the following equation:

$$C_{DUT}(t) = C_{Ref} * [I_{DUT}(t)/I_{Ref}(t)] \quad \text{Equation B}$$

where:
$C_{Ref}$ = the capacitance of the reference capacitor 52;
$I_{DUT}(t)$ = the current through the DUT 12 over time as measured by the second channel of the oscilloscope 16; and
$I_{Ref}(t)$ = the current through the reference capacitor 52 over time as measured by the third channel of the oscilloscope 16.

Computation of the equation may be performed by a processor 40, computing device, or other digital or analog circuit in or coupled to the oscilloscope 16 or that is provided the data. Those skilled in the art will recognize that in this embodiment the above equation does not include a coefficient (to factor in the amplifier gain and/or a conversion factor to convert a measured voltage to current), because such data may be inputted into the oscilloscope or into the automated software of the computing device and therefore need not to be included separately into the above equation (i.e., such coefficient is already factored in). In other embodiments, where the computing device does not accept such data, the above equation may include a coefficient. Having determined capacitance as a function of time from the equation above, and having the measured voltage (or known applied voltage) as a function of time, the capacitance can be plotted versus voltage on a time point by time point bases to provide the capacitance as a function of voltage (C(V)) at 619. The capacitance as a function of voltage is outputted in tabular or graphical format at 620.

Figure 7:
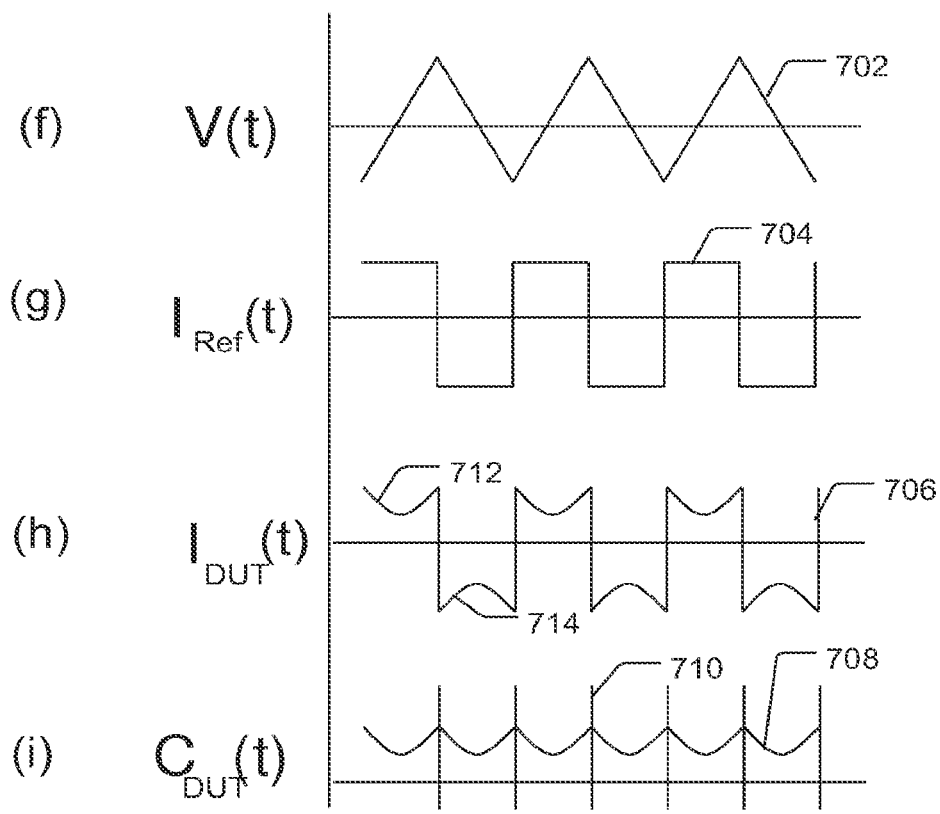
FIG. 7 depicts signal waveforms determined via a method of a second example embodiment according to the present invention.

FIG. 7 depicts signal waveforms measured or determined by the test configuration 50 implementing the example component capacitance determination method of FIG. 6. Graph (f) depicts a waveform 702 of the applied voltage as a function of time (i.e., V(t)) measured at the first channel 58 of the oscilloscope 16 with voltage corresponding to the vertical axis and time corresponding to the horizontal axis. As discussed, if a known voltage is applied, the voltage need not be measured. In this example, a triangular wave AC signal is generated by the AC voltage signal source 14.

Graph (g) depicts a waveform 704 of the current through the reference capacitor 52 as a function of time (i.e., $I_{Ref}(t)$) measured at the third channel 60 of the oscilloscope 16, with current corresponding to the vertical axis and time corresponding to the horizontal axis. It is noted that although the current through the reference capacitor 52 may pass through the current-to-voltage amplifier 56, the signal received at the oscilloscope third channel 60 is proportional to the current through the reference capacitor 52. For an applied triangular AC voltage signal, the $I_{REF}(t)$ waveform 704 has a generally square wave form since the capacitance of the reference capacitor is constant over the applied voltage.

Graph (h) depicts a waveform 706 of the current through the DUT as a function of time (i.e., $I_{DUT}(t)$) measured at the second channel 62 of the oscilloscope 16 with current corresponding to the vertical axis and time corresponding to the horizontal axis. It is noted that although the signal from the second terminal 22 of the DUT 12 may pass through the current-to-voltage amplifier 18, the signal received at the oscilloscope second channel 62 is proportional to the current through the DUT 12. Waveform 706 (i.e., $I_{DUT}(t)$) has a generally curved portion 712 (at a first polarity) during the increase in V(t), and an opposite generally curved portion 714 (at an opposite polarity) during the decrease in V(t). These curved portions 712 and 714 are related to the capacitance as a function of voltage or C(V) and may be outputted and stored.

Graph (i) depicts a waveform 708 of the capacitance of the DUT as a function of time (i.e., C(t)) computed using Equation B and data from waveforms 704 and 706, with capacitance corresponding to the vertical axis and time corresponding to the horizontal axis. The vertical lines 710 occur at instances when the direction of the current through the DUT changes.

As discussed above, the capacitance of the DUT in this example embodiment may be computed according to the following equation:

$$C_{DUT}(t)=C_{Ref}(t)*[I_{DUT}(t)/I_{Ref}(t)]$$

Figure 8:
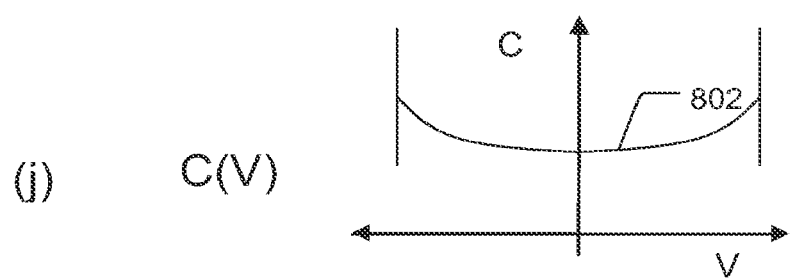
FIG. 8 depicts capacitance as a function of voltage determined via a method of the second example embodiment according to the present invention.

Having determined capacitance as a function of time from the equation above, and having measured voltage as a function of time, the capacitance can be plotted versus voltage on a time point by time point bases to provide the capacitance as a function of voltage (C(V)) for the applied voltage. FIG. 8 depicts a graph of the capacitance 802 of the DUT as a function of voltage with capacitance corresponding to the vertical axis and voltage corresponding to the horizontal axis. Thus, the graph of FIG. 8 may be generated by the data collected over one cycle of the applied AC signal such as, for example, a time point by time point plot of capacitance data of graph (i) of FIG. 7 versus the voltage data from graph (f) of FIG. 7. It also may be necessary to shift the data from one or all oscilloscope channels (i.e., a time shift to ensure the measurement data of the channels is synchronized in time) to account for different cable lengths (of the cables connected to the oscilloscope), especially at higher frequencies. As the amplitude of the voltage across the DUT increases (positively or negatively), the capacitance increases. Of particular interest is that the peak capacitance may be less than a maximum capacitance for the DUT that would be obtained by using a voltage signal having too long of a period (i.e., longer than the DUT capacitance characteristic time) or using a small signal measurement technique. Also of interest is that the capacitance is varying during the entire period of the applied AC voltage signal. Under an applied voltage signal having a period greater than the characteristic time, the capacitance may have a very different capacitance as a function of voltage. Accordingly, average capacitance of a component might be incorrectly calculated as too high and not reflect the variation depicted in graph (j) of FIG. 8. The values on the graph (j) may be output, stored and associated with the device under test 12 to characterize the DUT capacitance as a function of voltage. The test may be repeated using AC voltage signals having different amplitudes so that a plurality of curves is generated. Such characteristic curve may be beneficial for design engineers when selecting or otherwise evaluating a component to be included in a circuit or system.

In either of the above described embodiments, the amplitude of the applied AC voltage signal may be varied during a test to determine the response time of the DUT with regard to changes in signal amplitude. The response time also may be output.

The embodiments of the present invention provide methods and devices that are able to measure capacitance under conditions that more closely correspond to actual use conditions. The characteristic capacitance curves 402, 802 obtained according to various embodiments of the present invention may be beneficial to design engineers seeking to determine (or reduce) the harmonics, response times, insertion losses, and other performance characteristics of a component. For example, a low capacitance versus voltage indicates lower harmonics.

Prior to performing the above described example tests, it may be desirable to estimate the capacitance or to determine the capacitance using a conventional method (capacitance determined by either method referred to herein as an estimated capacitance). The estimated capacitance may be used as a basis to determine the characteristic time of the DUT and to determine whether amplifier 18 should be incorporated. For example, by multiplying a measured leakage current of a DUT by an estimated capacitance (e.g., determined by small signal application method), the characteristic time may be determined, which may be used to select the frequency of the applied AC voltage signal for the above described example embodiments.

While the above described embodiments employ an oscilloscope, other embodiments may instead use other test devices such a specifically designed test device having a digital signal processor (DSP) that is adapted to measure the voltage and current(s) and to compute and output the capacitance curves.

Thus, in one example embodiment the method of determining a capacitance of a device having a first terminal and a second terminal comprises connecting the first terminal of the device to a first channel of an oscilloscope, connecting a first terminal of a capacitor having a known capacitance to the first terminal of the device, connecting a second terminal of the device to a second channel of the oscilloscope, connecting a second terminal of the capacitor to a third channel of the oscilloscope, supplying an alternating current (AC) voltage to the first terminal of the device and the first terminal of the capacitor, determining a voltage as a function of time across the device while supplying the AC voltage from information collected by the first channel of the oscilloscope, determining a current through the device from information collected by the second channel of the oscilloscope while supplying the AC voltage to the first terminal of the device, determining a current through the capacitor from information collected by the third channel of the oscilloscope while supplying the AC voltage to the first terminal of the capacitor, computing a capacitance of the device as a function of time by multiplying the capacitance of the capacitor by the ratio of the current through the device to the current through the capacitor, determining a capacitance of the device as a function of voltage based on the computed capacitance as a function of time and the voltage across the device as a function of time, and outputting data of the capacitance of the device as a function of voltage. Computing a capacitance of the device as a function of time may comprise multiplying the capacitance of the capacitor by the ratio of the current through the device to the current through the capacitor for a plurality of voltages of a single cycle of the applied AC voltage.

In another example embodiment, the method of determining a capacitance of a device having a first terminal and a second terminal may comprise connecting a first terminal of a capacitor having a known capacitance to the first terminal of the device, applying an AC voltage having a first amplitude to the first terminal of the device and the first terminal of the capacitor, measuring an instantaneous current through the capacitor while applying the AC voltage having the first amplitude to the first terminal of the capacitor, measuring an instantaneous current through the device while applying the AC voltage having the first amplitude to the first terminal of the device, determining a first voltage across the device as a function of time while the AC voltage having the first amplitude is applied to the first terminal of the device, computing a first capacitance of the device as a function of time by multiplying the capacitance of the capacitor by the ratio of the instantaneous current through the device to the instantaneous current through the capacitor during application of the AC voltage having the first amplitude, determining a first capacitance of the device as a function of voltage based on the first capacitance as a function of time and the first voltage across the device as a function of time, and outputting data of the first capacitance of the device as a function of voltage. Computing a first capacitance of the device as a function of time comprises multiplying the capacitance of the capacitor by the ratio of the instantaneous current through the device to the instantaneous current through the capacitor for a plurality of voltages of a single cycle of the applied AC voltage. The method may further include changing an amplitude of the applied AC voltage, measuring a response time of the device, and outputting data of the measured response time.

In yet another example embodiment, the method of determining a capacitance of a device having a first terminal and a second terminal may comprise connecting a first terminal of a capacitor having a known capacitance to the first terminal of the device, applying an AC voltage to the first terminal of the device and the first terminal of the capacitor, measuring a plurality of instantaneous currents through the capacitor while applying the AC voltage, concurrently with said measuring a plurality of currents through the capacitor, measuring a plurality of instantaneous currents through the device, wherein each of the plurality of measured instantaneous currents through the capacitor corresponds in time to one of the plurality of measured instantaneous currents through the device, for each of the plurality of measured instantaneous currents through the capacitor and the corresponding one of the plurality of measured instantaneous currents through the device, multiplying the capacitance of the capacitor by the ratio of the measured instantaneous current through the device to the measured instantaneous current through the capacitor to provide a capacitance of the device as a function of time, determining a capacitance of the device as a function of voltage based on the computed capacitance as a function of time and a voltage across the device as a function of time, and outputting data of the capacitance of the device as a function of voltage.

In still another example embodiment, the invention may take the form of a computer program product comprising a tangible computer usable medium having a computer readable program code embodied therein, the computer readable program code adapted to be executed to implement a method for determining a capacitance of a device, the method comprising receiving data of an instantaneous current through a capacitor while an AC voltage is supplied to a first terminal the capacitor, receiving data of an instantaneous current through the device while the AC voltage is supplied to a first terminal the device, receiving data of a voltage across the device as a function of time, wherein the first terminal of the device is connected to the first terminal of the capacitor and the data of the instantaneous current through the device and the data of the instantaneous current through the capacitor are from measurements take concurrently, for a plurality of voltages across the device, computing a capacitance of the device as a function of time by multiplying a capacitance of the capacitor by a ratio of the instantaneous current through the device to the instantaneous current through the capacitor, determining a capacitance of the device as a function of voltage based on the computed capacitance as a function of time and the data of the voltage across the device as a function of time; and outputting data of the capacitance of the device as a function of voltage.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A method of determining a capacitance of a device having a first terminal and a second terminal, comprising:
   connecting the first terminal of the device to a first channel of an oscilloscope;
   connecting a first terminal of a capacitor having a known capacitance to the first terminal of the device;
   connecting a second terminal of the device to a second channel of the oscilloscope;
   connecting a second terminal of the capacitor to a third channel of the oscilloscope;
   supplying an alternating current (AC) voltage to the first terminal of the device and the first terminal of the capacitor;
   determining a voltage as a function of time across the device while supplying the AC voltage from information collected by the first channel of the oscilloscope;
   determining a current through the device from information collected by the second channel of the oscilloscope while supplying the AC voltage to the first terminal of the device;
   determining a current through the capacitor from information collected by the third channel of the oscilloscope while supplying the AC voltage to the first terminal of the capacitor;
   computing a capacitance of the device as a function of time by multiplying the capacitance of the capacitor by the ratio of the current through the device to the current through the capacitor;
   determining a capacitance of the device as a function of voltage based on the computed capacitance as a function of time and the voltage across the device as a function of time; and
   outputting data of the capacitance of the device as a function of voltage.

2. The method according to claim 1, wherein said connecting the second terminal of the device to the second channel of the oscilloscope, comprises:
   connecting the second terminal of the device to the second channel of the oscilloscope through an amplifier.

3. The method according to claim 1, wherein said connecting the second terminal of the capacitor to the third channel of the oscilloscope, comprises:
   connecting the second terminal of the capacitor to the third channel of the oscilloscope through an amplifier.

4. The method according to claim 1, wherein the AC voltage comprises a triangle wave.

5. The method according to claim 1, wherein said computing a capacitance of the device as a function of time comprises multiplying the capacitance of the capacitor by the ratio of the current through the device to the current through the capacitor for a plurality of voltages of a single cycle of the applied AC voltage.

6. The method according to claim 1, wherein the AC voltage has a period that is less than the characteristic time for a capacitance as a function of time of the device by factor of at least ten.

7. A computer program product comprising a non-transitory tangible computer usable medium having a computer readable program code embodied therein, said computer readable program code adapted to be executed to implement a method for determining a capacitance of a device, comprising:

connecting a first terminal of the device to a first terminal of a capacitor, the capacitor having a first capacitance that is not a function of time and the capacitance of the device having a function of time;

receiving data of an instantaneous current through the capacitor while an AC voltage is supplied to the first terminal of the capacitor and receiving data of an instantaneous current through the device while the AC voltage is supplied to the first terminal the device;

receiving data of a voltage across the device as a function of time;

wherein the data of the instantaneous current through the device and the data of the instantaneous current through the capacitor are from measurements taken concurrently;

determining the capacitance of the device as a function of time by multiplying the first capacitance of the capacitor by a ratio of the instantaneous current through the device to the instantaneous current through the capacitor;

determining a capacitance of the device as a function of voltage based on the determined capacitance as a function of time and the data of the voltage across the device as a function of time; and outputting data of the capacitance of the device as a function of voltage.

8. The computer program product according to claim 7, wherein said computing the capacitance of the device as the function of time comprises multiplying the capacitance of the capacitor by the ratio of the instantaneous current through the device to the instantaneous current through the capacitor for a plurality of voltages of a single cycle of the supplied AC voltage.

* * * * *